(12) United States Patent
Lee et al.

(10) Patent No.: US 7,701,748 B2
(45) Date of Patent: Apr. 20, 2010

(54) NONVOLATILE MEMORY DEVICES USING VARIABLE RESISTORS AS STORAGE ELEMENTS AND METHODS OF OPERATING THE SAME

(75) Inventors: Jang-Eun Lee, Gyeonggi-do (KR);
Se-Chung Oh, Gyeonggi-do (KR);
Kyung-Tae Nam, Gyeonggi-do (KR);
Jun-Ho Jeon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 327 days.

(21) Appl. No.: 11/983,664

(22) Filed: Nov. 9, 2007

(65) Prior Publication Data
US 2008/0123394 A1    May 29, 2008

(30) Foreign Application Priority Data
Nov. 9, 2006    (KR) ...................... 10-2006-0110718

(51) Int. Cl.
*G11C 11/00* (2006.01)
(52) U.S. Cl. ...................................................... 365/148
(58) Field of Classification Search .................. 365/148
See application file for complete search history.

(56) References Cited

U.S. PATENT DOCUMENTS 6,801,451 B2    10/2004    Tran et al. .................... 365/158

FOREIGN PATENT DOCUMENTS

| JP | 2004-079632 | 3/2004 |
|---|---|---|
| KR | 10-2004-0014916 | 2/2004 |
| KR | 10-2005-0118601 | 12/2005 |
| KR | 1020060086996 A | 8/2006 |
| KR | 1020060105360 A | 10/2006 |
| KR | 1020060108960 A | 10/2006 |

*Primary Examiner*—Evan Pert
(74) *Attorney, Agent, or Firm*—Myers Bigel Sibley & Sajovec

(57) ABSTRACT

A nonvolatile memory device includes a first electrode and a second electrode, and a variable resistor interposed between the first and second electrodes. The variable resistor has a critical voltage, and a resistance-voltage characteristic of the variable resistor is switched at a voltage higher than the critical voltage, so that a resistance of the variable resistor is higher at a read voltage applied after the switching of the resistance-voltage curve than at a read voltage applied before the switching of the resistance-voltage curve. Methods of operating a nonvolatile memory device include setting a plurality of write voltages higher than an initial critical voltage, assigning respective data values to states in which a resistance-voltage characteristic is switched at the write voltages, setting a read voltage lower than the initial critical voltage, and reading the data values by measuring current flowing through the variable resistor in response to the read voltage.

25 Claims, 14 Drawing Sheets

NONVOLATILE MEMORY DEVICES USING VARIABLE RESISTORS AS STORAGE ELEMENTS AND METHODS OF OPERATING THE SAME

CROSS-REFERENCE TO RELATED APPLICATIONS

This U.S. non-provisional patent application claims priority under 35 U.S.C §119 to Korean Patent Application 2006-110718 filed on Nov. 11, 2006, the disclosure of which is hereby incorporated herein by reference.

BACKGROUND

The present invention relates to semiconductor devices and methods of operating the same, and more particularly, to nonvolatile memory devices and methods of operating the same.

In recent years, due to the increased demands for semiconductor devices applicable to various fields, a vast amount of research has been conducted on memory devices that are capable of meeting various requirements, such as large capacity, small size, high speed, low power consumption, and high integration density.

For example, ferroelectric random access memory devices (FeRAMs), magnetic RAMs (MRAMs), and ovonic unified RAMs (OUMs) have been proposed as advanced nonvolatile memory devices. An FRAM, which uses spontaneous polarization of ferroelectric materials, has potential advantages of low power consumption and high-speed operation. However, the FRAM can have high fabrication costs and can have relatively poor data retention characteristics. An MRAM is a ferromagnetic tunneling device using a giant magneto-resistive (GMR) effect. The MRAM can consume relatively high power for magnetization switching and can have certain technical limitations on increasing the degree of integration. A phase-change RAM (PRAM), such as an OUM, can consume a relatively high amount of power for switching a current.

In order to address some issues of the above-described RAMs, a resistive RAM (RRAM) using an electric pulse induced resistive (EPIR) effect has been proposed. The RRAM can reduce power consumption and/or increase the degree of integration, and its resistance can vary within a relatively wide range, which may permit realization of multi-bit storages.

A conventional EPIR device uses a variable resistor having a Perovskite structure based on a network of oxygen-octahedrals centering on 3d-transition metallic elements, more specifically, $Pr_{1-x}Ca_xMnO_3$ (hereinafter referred to as a PCMO), $La_{1-x}Ca_xMnO_3$, $La_{1-x}Sr_xMnO_3$, $Gd_{0.7}Ca_{0.3}BaCO_2O_{5+5}$ and the like. It has been said that of these materials, PCMO having a composition close to x=0.3 may show a wide range of resistance value variation. However, forming a PCMO layer having a uniform Perovskite structure is difficult, and fabrication of the variable resistor should not be followed by a process performed at a high temperature (e.g. 400° C. or higher) because one or more properties of the variable resistor may be changed by the high temperature. Further, it is known that a decrease of resistance can require a pulse of 1 to 100 μs and a voltage of 0.5 to 10 V, and an increase of resistance can require a pulse of 10 to 1000 ns and a voltage of about 1.5 to 2.5 times the voltage required by the decrease of resistance.

SUMMARY

Some embodiments of the present invention provide nonvolatile memory devices that may be thermally stable during fabrication thereof and/or that can operate at high speeds and/or reduce power consumption, and methods of operating the same.

Also, some embodiments of the present invention can provide nonvolatile memory devices that can store multi-bit data and/or that can increase the degree of integration, operate at high speed, and/or reduced power consumption, and methods of operating the same.

Exemplary embodiments of the present invention are directed to a nonvolatile memory device using a variable resistor as a storage element. In some embodiments, the device includes a first electrode, a second electrode, and a variable resistor interposed between the first and second electrodes. The variable resistor has a critical voltage, and a resistance-voltage characteristic of the variable resistor is switched at a voltage higher than the critical voltage so that a resistance of the variable resistor is higher when measured at a read voltage after the switching of the resistance-voltage characteristic than when measured at the read voltage before the switching of the resistance-voltage characteristic.

In some embodiments of the present invention, when a voltage applied to the variable resistor rises to a first voltage lower than the critical voltage and subsequently drops, the resistance of the variable resistor in a period in which the applied voltage drops from the first voltage returns along a resistance-voltage curve followed in a period in which the applied voltage rises to the first voltage. Also, when the voltage applied to the variable resistor rises to a switching voltage that is higher than the critical voltage and subsequently drops, the resistance of the variable resistor is higher in the period in which the applied voltage drops from the switching voltage than in the period in which the applied voltage rises to the switching voltage. Further, when a voltage higher than the critical voltage is applied to the variable resistor, the critical voltage increases.

Some embodiments of the present invention are directed to methods of operating a nonvolatile memory device using a variable resistor as a storage element. The methods include setting a plurality of write voltages higher than an initial critical voltage, assigning respective data values to states where a resistance-voltage curve is switched at the write voltages, setting a read voltage lower than the initial critical voltage, and reading the data values by measuring current flowing through the variable resistor in response to the read voltage.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1A:
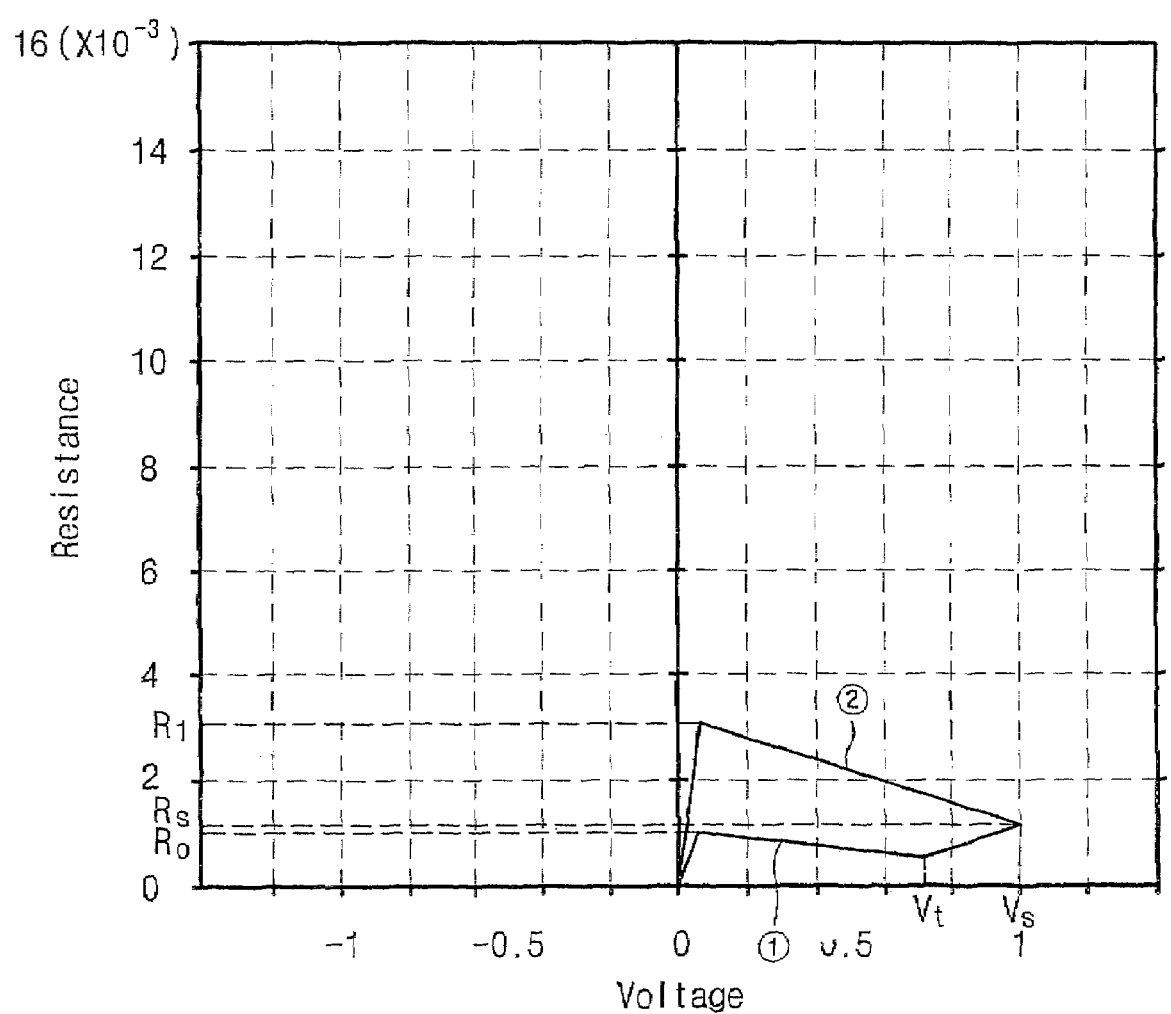
FIGS. 1A and 1B are graphs showing resistance-voltage characteristics and current-voltage characteristics, respectively, of a nonvolatile memory device according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the invention.

Figure 8:
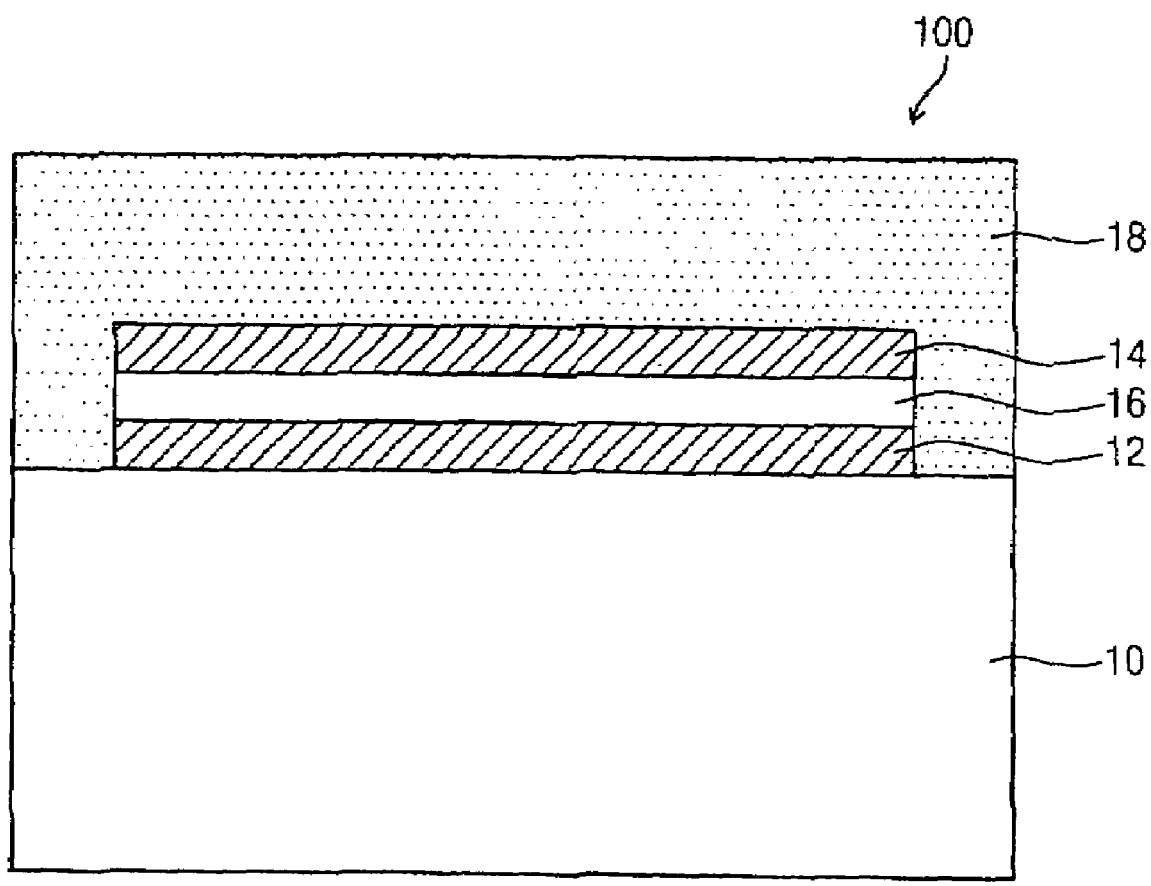
FIG. 8 is a schematic illustration of a nonvolatile memory device according to some embodiments of the invention.

Referring to FIG. 8, a nonvolatile memory device according to some embodiments of the present invention includes a data storage element 100 including first and second electrodes 12, 14 and a variable resistor 16 interposed between the first and second electrodes 12, 14. The data storage element 100 may have a stacked structure similar to a metal-insulator-metal (MIM) capacitor. The data storage element 100 can be formed on a substrate 10 and can be protected by an insulation layer 18. The variable resistor 16 may include an oxide layer, such as a magnesium oxide layer, a hafnium oxide layer, a zirconium oxide layer, a titanium oxide layer, and/or a silicon oxide layer. The present invention can make use of direct tunneling and/or negative differential resistance (NDR) behavior that can occur in an insulating layer with a small thickness, for example, a thickness of 15 Å or less.

Figure 1B:
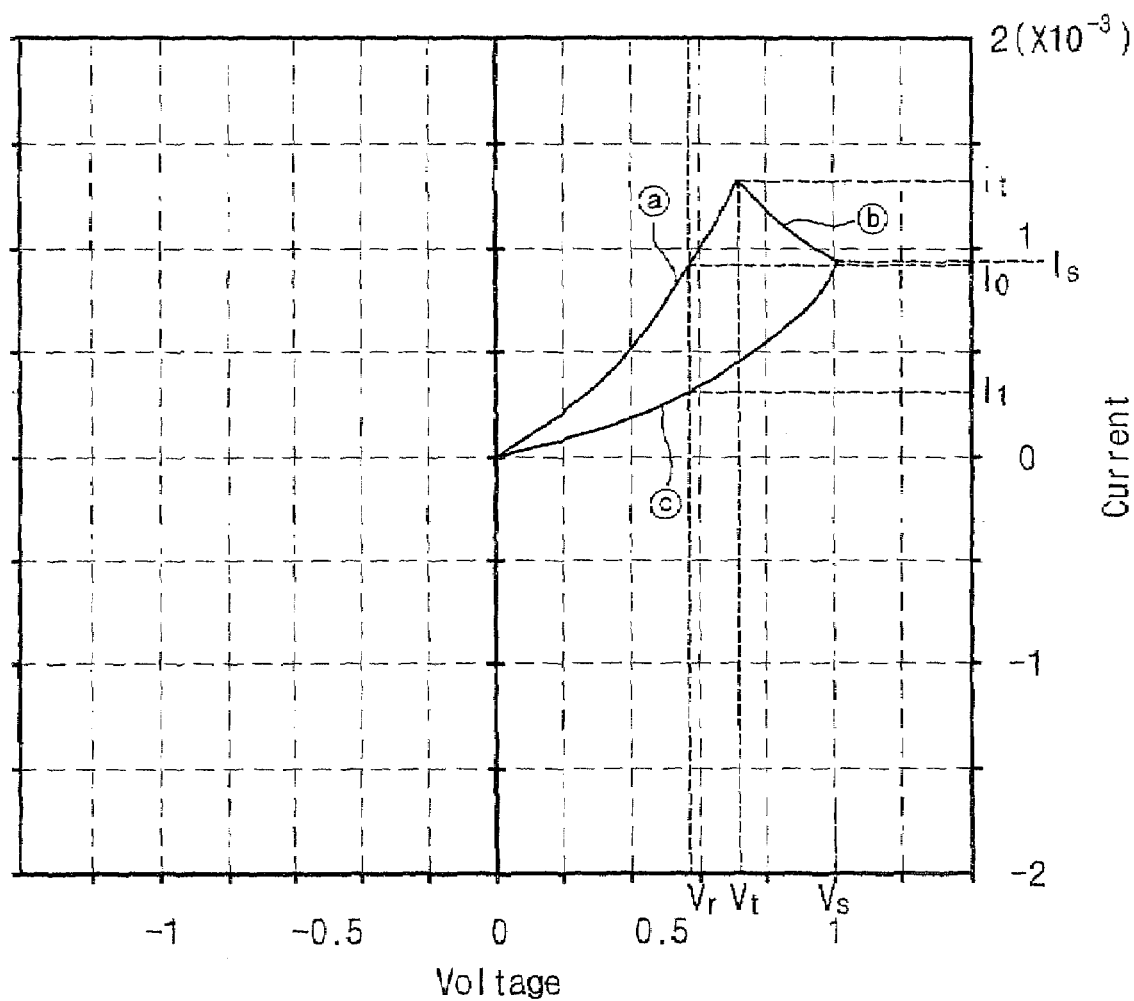

FIGS. 1A and 1B are graphs showing resistance-voltage characteristics and current-voltage characteristics, respectively, of a nonvolatile memory device according to some embodiments of the present invention.

Referring to FIG. 1A, as a result of experiments, it is confirmed that when an oxide layer, such as a magnesium oxide layer or a titanium oxide layer, has a thickness of about 5 to 15 Å, a leakage caused by direct tunneling can occur, and when an applied voltage rises, the resistance of the oxide layer varies with the voltage due to NDR behavior at a time point in which no breakdown happens. When a voltage is applied to a variable resistor according to some embodiments of the present invention, the resistance of the variable resistor can drop from an initial resistance $R_0$ during a voltage rising period (1) until the applied voltage rises to a critical voltage $V_r$. As the applied voltage becomes higher than the critical voltage $V_r$, the resistance of the variable resistor increases and reaches a value $R_s$ higher than the initial resistance $R_0$ at a switching voltage $V_s$.

After the applied voltage rises to the switching voltage $V_s$, a resistance-voltage curve is switched during a voltage dropping period (2), so that the resistance of the variable resistor returns along a different path than in the voltage rising period (1). In this case, the resistance of the variable resistor is higher in the voltage dropping period (2) than in the voltage rising period (1), and reaches a switched resistance $R_1$ that is higher than the initial resistance $R_0$ when the applied voltage drops to about 0.

Although not bound by any particular theory of operation, from the results shown in FIG. 1A, it is believed that as the voltage rises from 0 Volts, trapped charges that can hinder the flow of current are detrapped from the variable resistor and the resistance of the variable resistor is reduced until the applied voltage rises to the critical voltage $V_r$. Thereafter, a potential barrier of the variable resistor becomes higher due to current-induced trapped charges and/or an NDR behavior occurs so that the flow of charges is hindered due to a coulomb blockade effect. However, irrespective of the analysis of the NDR behavior, the variable resistor can be used as a storage based on the results obtained using the insulating layer with a thickness of 5 to 15 Å during a sub-breakdown voltage direct tunneling period. In this case, when the areas of the first and second electrodes are small, the amount of current tunneled by the variable resistor is restricted, thereby increasing the breakdown voltage of the insulating layer. Therefore, in order to make good use of the NDR behavior in a predetermined voltage period, the area of the variable resistor may be made small. In some embodiments, the variable resistor may have a lateral dimension of less than 100 nm. For example, the variable resistor may have a width of about 10 nm to about 60 nm.

Referring to FIG. 1B, which shows a current-voltage curve of a variable resistor according to some embodiments, a current through the variable resistor increases to a critical current $I_t$ during the voltage rising period (a) until an applied voltage rises to a critical voltage $V_t$. However, during a post-critical voltage ($V_t$) period (b), the resistance of the variable resistor increases so that the current therethrough may sharply decrease. After the applied voltage rises to a switching voltage $V_s$ and the voltage begins to drop, the current gradually decreases from a switching current $I_s$ with the drop in the voltage. During a voltage dropping period (c), the current returns along a different path than in the voltage rising period (a). As can be seen from FIG. 1B, as the resistance of the variable resistor is switched, the current is lower in the voltage dropping period (c) than in the voltage rising period (a).

Referring to FIGS. 1A and 1B, in the case of an initial variable resistor, when an applied voltage rises to a voltage lower than the critical voltage $V_t$ and then drops, the resistance returns along the resistance-voltage curve in the voltage rising period (1), and the current returns along the current-voltage curve in the voltage rising period (a). By comparison, after the switching voltage $V_s$ has been applied to the variable resistor, the critical voltage of the variable resistor rises, so that the applied voltage rises to a voltage that may exceed the initial critical voltage $V_t$ but is below the switching voltage $V_s$. Thus, when the applied voltage drops, the resistance returns along the resistance-voltage curve followed in the initial voltage dropping period (2), and the current returns along the current-voltage curve followed in the initial voltage dropping period (b).

Referring to FIG. 1B, when a current is read through the variable resistor at a read voltage $V_r$ that is lower than the initial critical voltage $V_t$, a first current $I_0$ is detected before the variable resistor is switched, and a second current $I_1$ is detected after the variable resistor is switched. The detection of the first current $I_0$ may correspond to a data '0', and the detection of the second current $I_1$ may correspond to a data '1' to store 1-bit data.

After the applied voltage rises higher than a critical voltage, curves along which current and resistance values return vary according to the applied voltage. Specifically, as a switching voltage becomes higher, a resistance returns along a curve having higher values, current returns along a curve having lower values, and the critical voltage increases in proportion to the switching voltage.

Figure 2A:
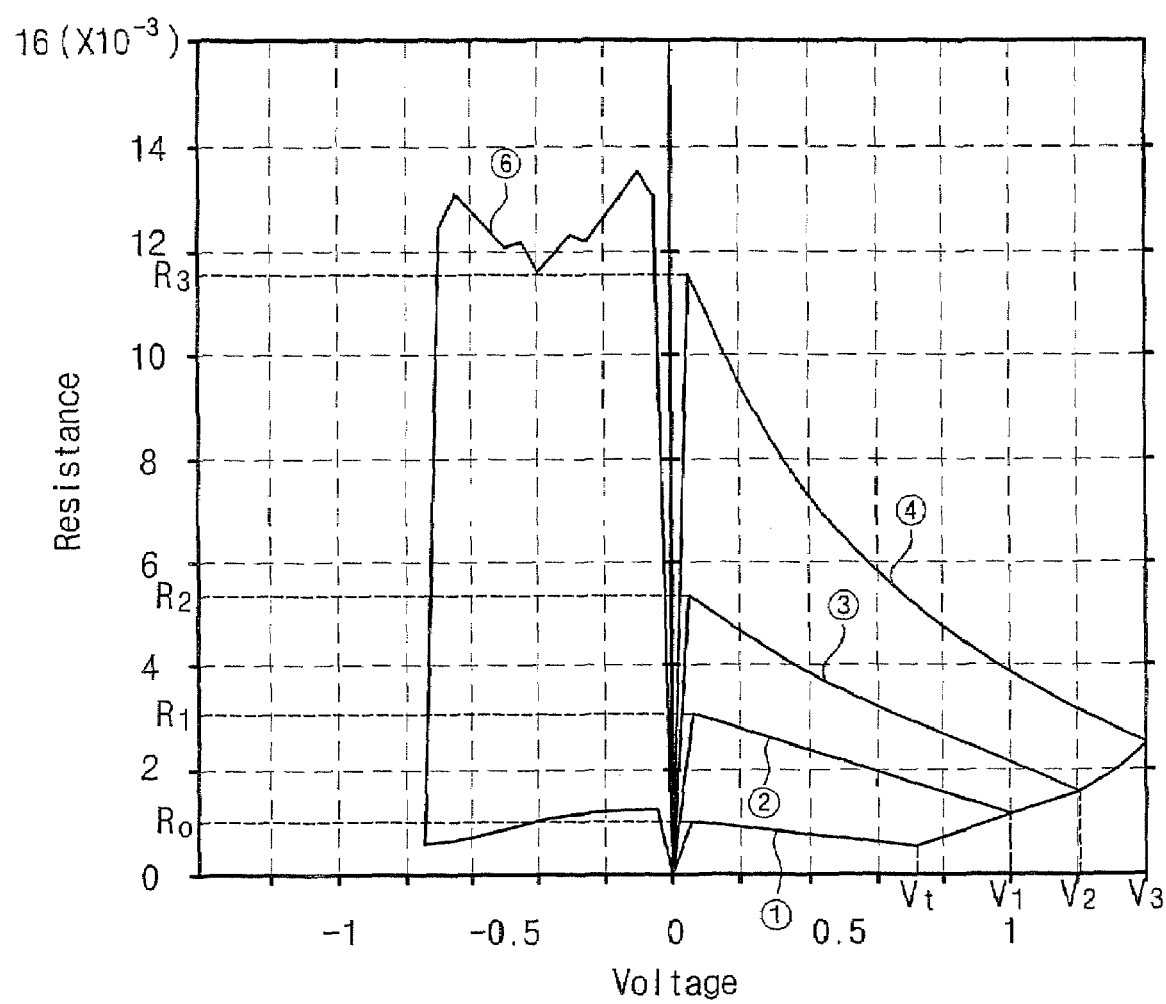
FIGS. 2A and 2B are graphs showing a resistance and current with respect to an applied voltage where a plurality of switching voltages are set.
Figure 2B:
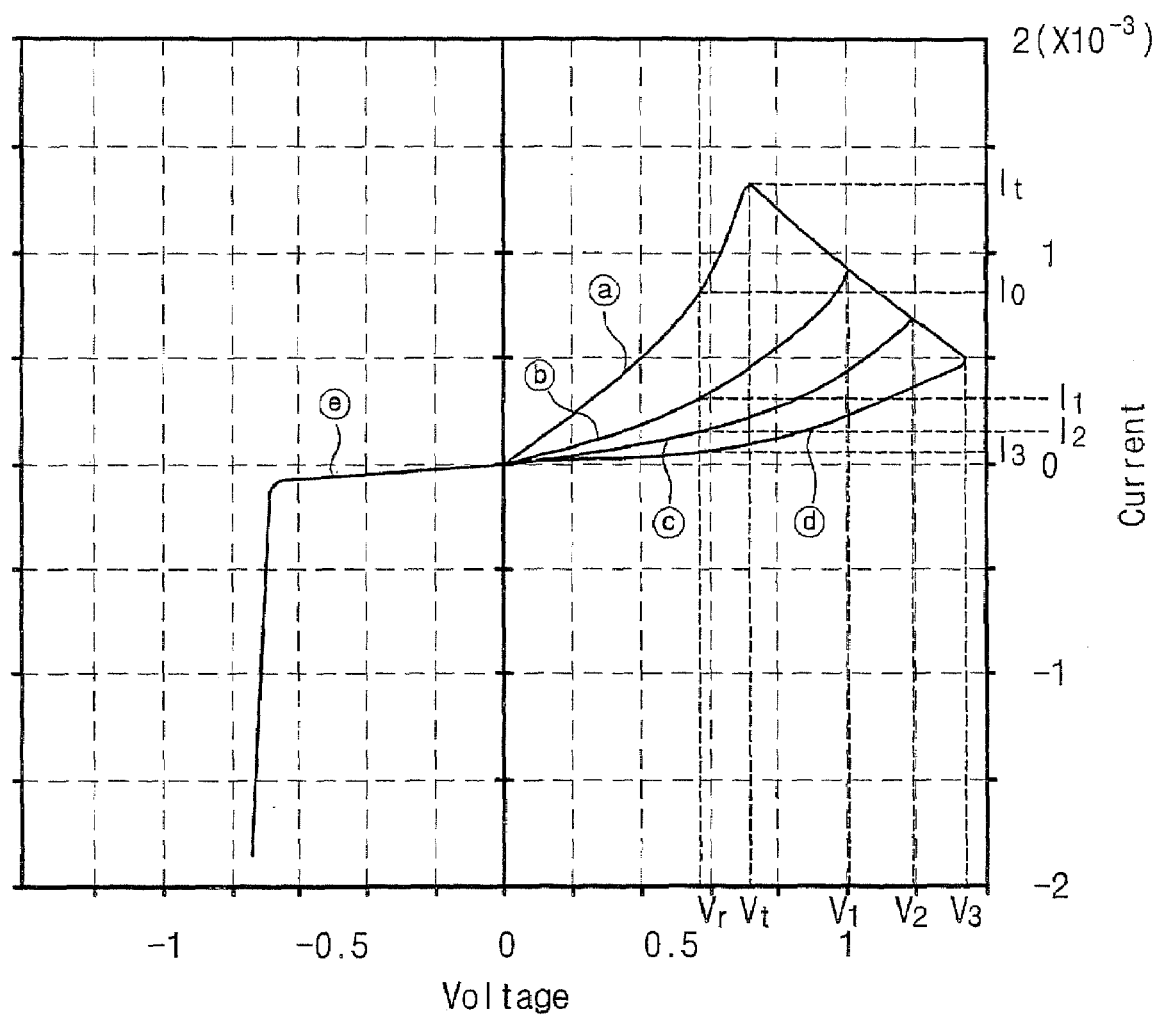

FIGS. 2A and 2B are graphs showing resistance and current of a variable resistor according to embodiments of the invention with respect to an applied voltage where a plurality of switching voltages are set.

Referring to FIG. 2A, a plurality of switching voltages $V_1$, $V_2$, and $V_3$ higher than an initial critical voltage $V_t$ are defined. Thus, when an applied voltage rises to each of the switching voltages $V_1$, $V_2$, and $V_3$ and drops, a resistance-voltage curve in a voltage dropping period follows a different path than a resistance-voltage curve in a voltage rising period.

For instance, first through third switching voltages $V_1$, $V_2$, and $V_3$ are defined. When the resistance of a variable resistor starts from an initial resistance $R_0$, rises along a first path (1) until an applied voltage reaches the first switching voltage $V_1$, it corresponds to a first switched resistance $R_1$ that returns along a second path (2). When the resistance of the variable resistor starts from the initial resistance $R_0$, rises along the first path (1) until the applied voltage reaches the second switching voltage $V_2$, it corresponds to a second switched resistance $R_2$ that returns along a third path (3). When the resistance of the variable resistor starts from the initial resistance $R_0$, and rises along the first path (1) until the applied voltage reaches the third switching voltage $V_3$, it corresponds to a third switched resistance $R_3$ that returns along a fourth path (4).

When the applied voltage rises to a voltage lower than the critical voltage $V_t$ and then drops, the resistance of an initial variable resistor returns along the same path as in the voltage rising period. After the applied voltage rises to an n-th switching voltage $V_n$, the critical voltage rises so that even if the applied voltage rises to a voltage lower than a changed critical voltage and drops, the resistance of the variable resistor returns along the n+1-th path.

Reference is made to FIG. 2B, which shows a current-voltage curve with respect to a switching voltage for a variable resistor according to embodiments of the invention, and which is related to the resistance-voltage characteristics. A plurality of switching voltages $V_n$ higher than the initial critical voltage $V_t$ are defined. In this case, when an applied voltage rises to the respective switching voltages $V_n$ and drops, current returns along different paths and the critical voltage is changed.

For example, after current increases along a first path (a) in an initial voltage rising period, when an applied voltage rises to first through third switching voltages $V_1$, $V_2$, and $V_3$ and then drops, the current-voltage curve is switched so that the current returns along second, third, and fourth paths (b), (c), and (d), respectively. The critical voltage rises with each of the switching voltages $V_1$, $V_2$, and $V_3$, so that after the current-voltage curve is switched, when a voltage lower than the changed critical voltage is applied, the current returns along the same path as in the voltage rising period. Based on the above-described results, the variable resistor can be used as a storage for storing multi-bit data according to embodiments of the invention.

That is, by setting a read voltage $V_r$ lower than the initial critical voltage $V_t$ and measuring current flowing through the variable resistor, respective data values may be given to current $I_0$ of the initial variable resistor, a first switched current $I_1$, a second switched current $I_2$, and a third switched current $I_3$, respectively, so that 2-bit data can be stored.

As a result, multi-bit data can be stored by dividing a switching voltage at a sub-breakdown voltage of the variable resistor. A voltage having an opposite polarity to an applied voltage applied for writing data is applied to the variable resistor, so that the variable resistor can be initialized. That is, by applying a reset voltage having an opposite polarity to a write voltage to the variable resistor, the resistance of the variable resistor sharply drops as shown in a period (6) of FIG. 2A, so that an absolute value of the current can sharply jump along a path (e) of FIG. 2B and the variable resistor can thereby be initialized.

FIGS. 3A through 3D are graphs illustrating methods of operating nonvolatile memory devices according to some embodiments of the present invention.

Figure 3A:
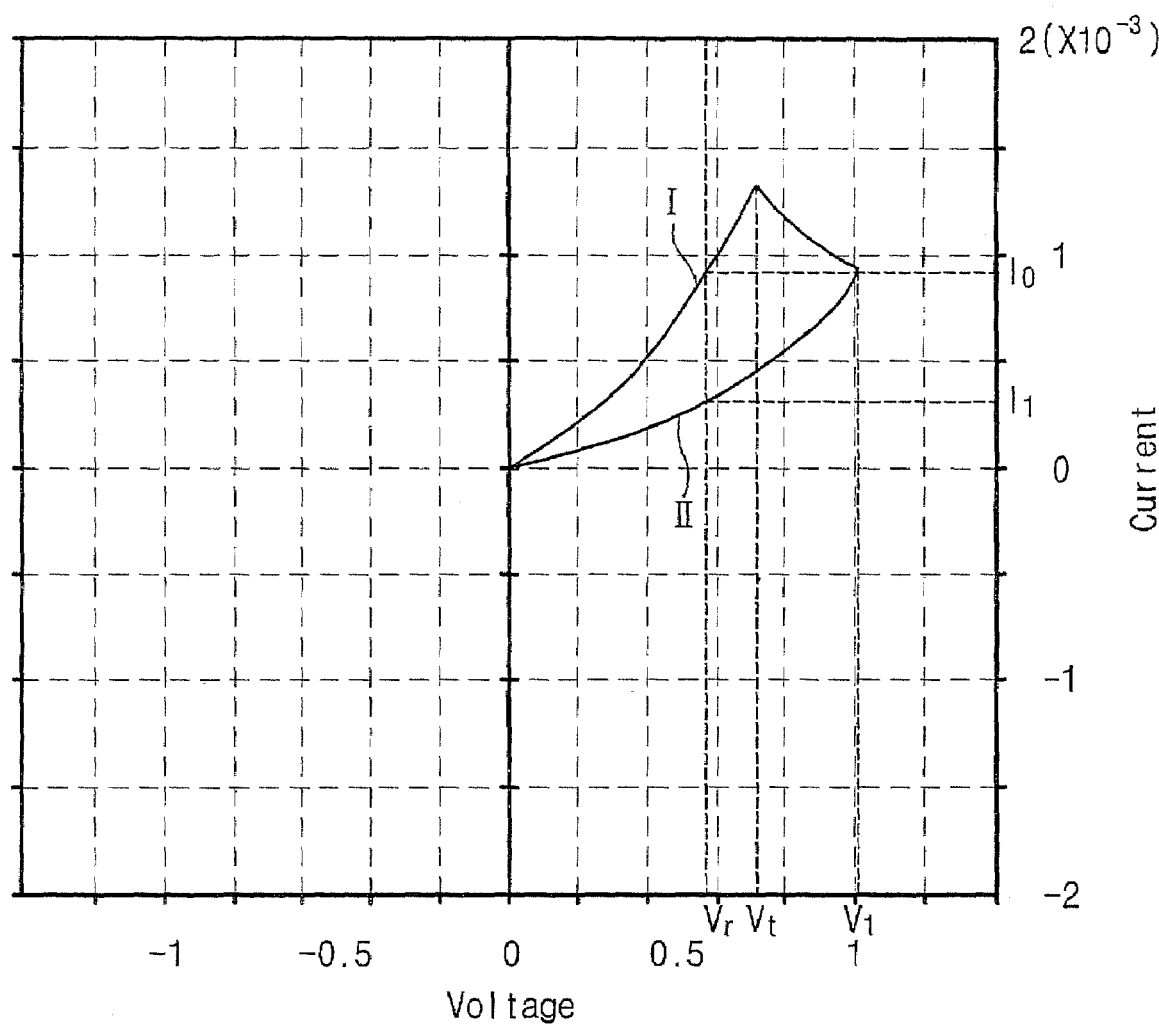
FIGS. 3A through 3D are graphs illustrating methods of operating a nonvolatile memory device according to some embodiments of the present invention.
Figure 3B:
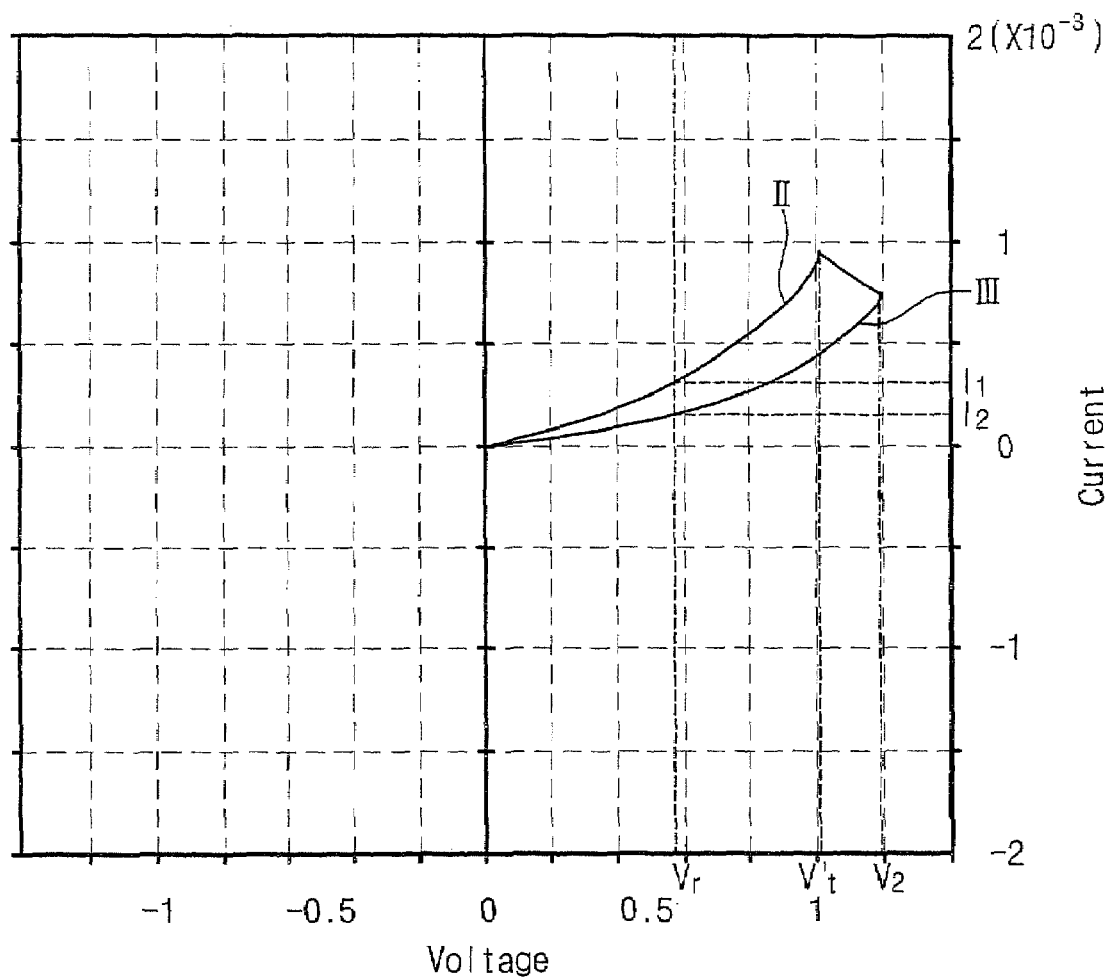
Figure 3C:
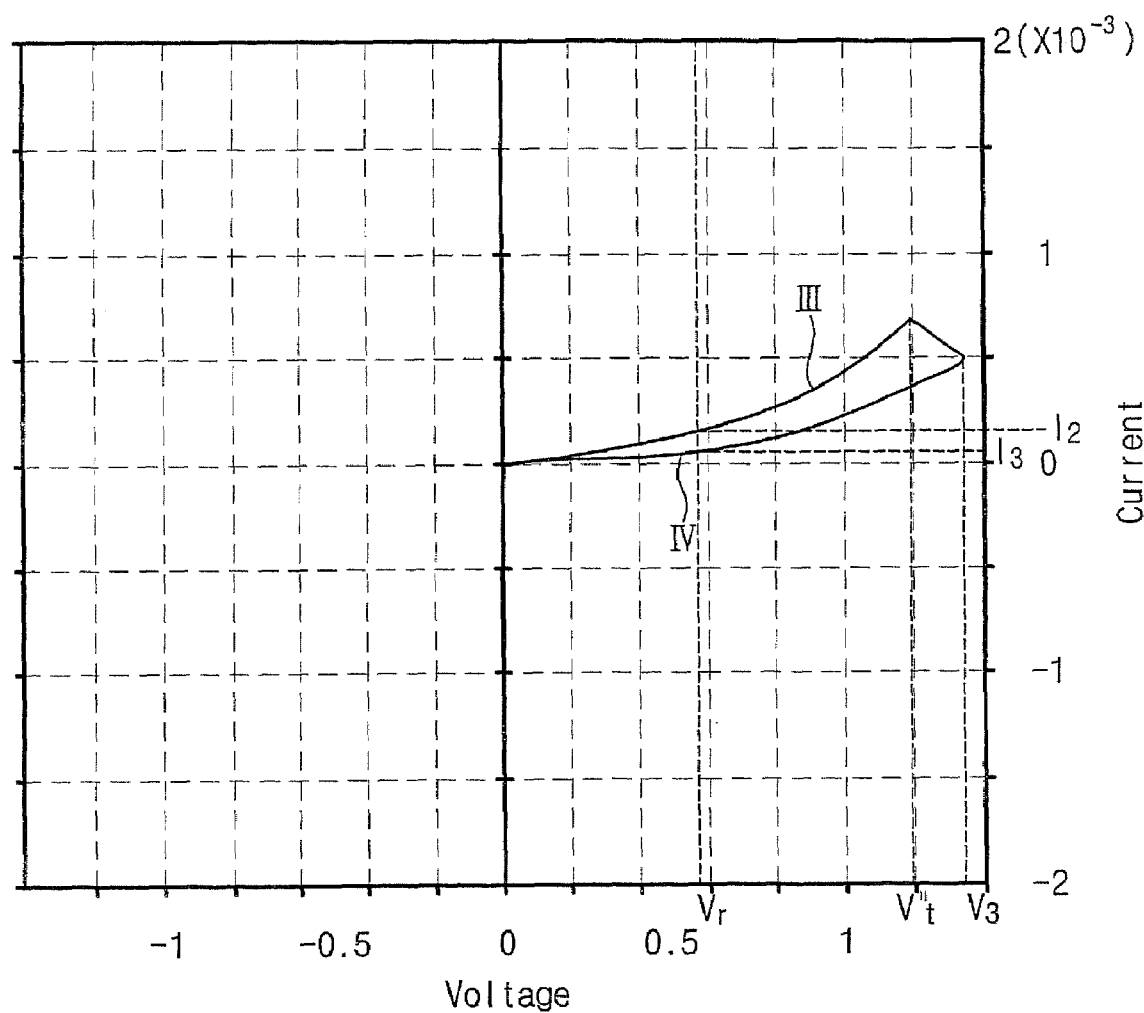
Figure 3D:
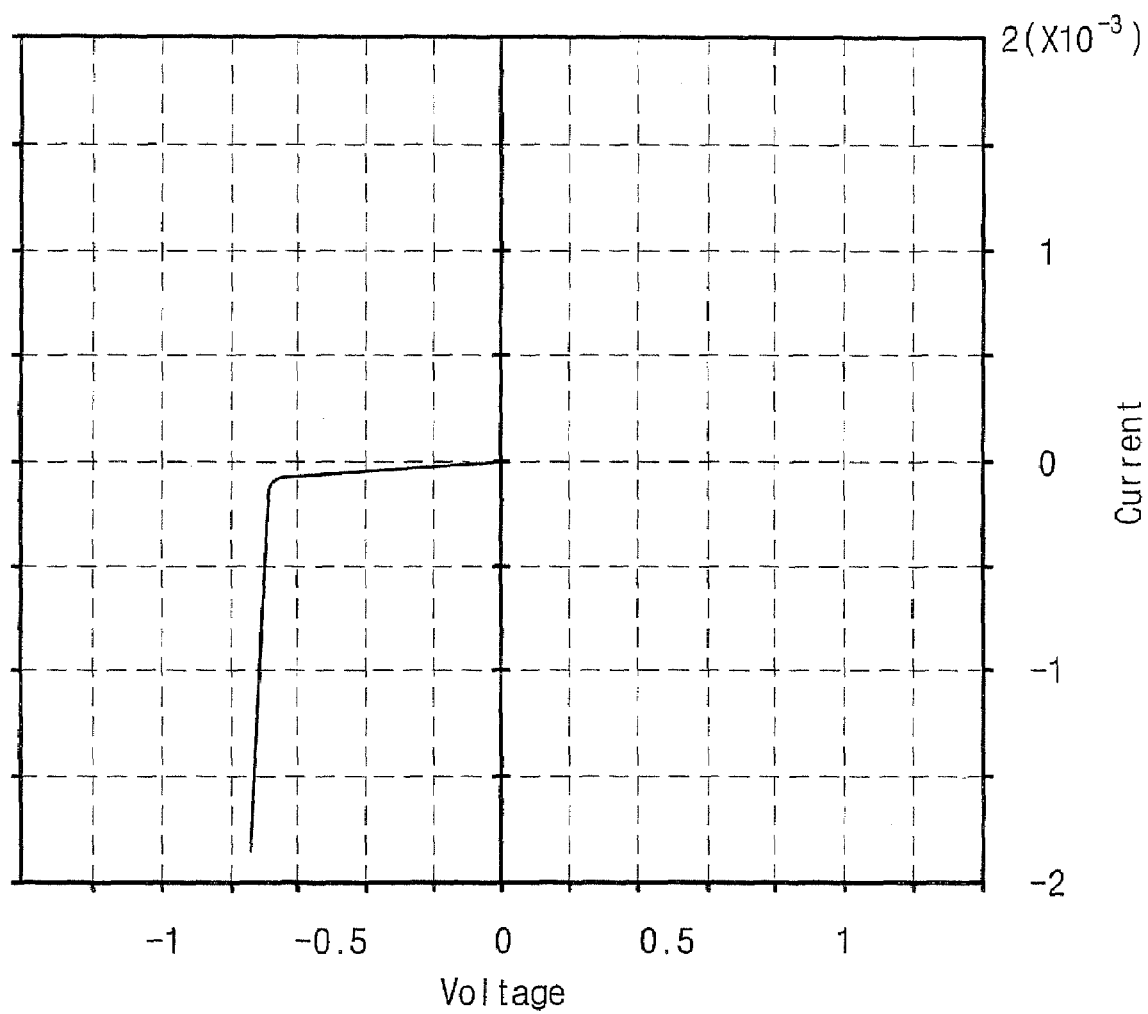

Specifically, FIG. 3A is a graph showing writing of data '10' from data '00', FIG. 3B is a graph showing writing of data '10' from data '01', FIG. 3C is a graph showing writing of data '11' from data '10', and FIG. 3D is a graph showing a reset of data.

Referring to FIG. 3A, in an initialization state (data '00'), when a voltage applied to a variable resistor rises to a predetermined voltage level lower than that of a first critical voltage $V_t$ and drops, current increases and then decreases along a first path I. When the applied voltage rises to a first switching voltage $V_1$ higher than the first critical voltage $V_t$ and drops, the current follows the first path I during a voltage rising period and follows a second path II during a voltage dropping period. After a current-voltage curve is switched at the first switching voltage $V_1$, when the voltage is applied to the variable resistor, the current varies along the second path II.

When current flowing through the variable resistor is measured at a read voltage $V_r$ lower than the first critical voltage $V_t$, detection of a first current value $I_0$ on the first path I corresponds to a data '00', while detection of a second current value $I_1$, on the second path II corresponds to a data '01'.

Referring to FIG. 3B, after the voltage-current curve is switched at the first switching voltage $V_1$, a critical voltage of the variable resistor rises to a second critical voltage $V_t'$. The second critical voltage $V_t'$ may be equal to or higher than the first switching voltage $V_1$. When the current-voltage curve follows the second path II, the current sharply decreases at a higher voltage than the second critical voltage $V_t'$. When the voltage rises to a second switching voltage $V_2$ higher than the second critical voltage $V_t'$ and then drops, the current-voltage curve returns along a third path III.

When current flowing through the variable resistor is measured at the read voltage lower than the first critical voltage $V_t$, the detection of the second current value $I_1$ on the second path II corresponds to a data '01', while detection of a third current value $I_2$ on the third path III corresponds to a data '10'.

Referring to FIG. 3C, after the voltage-current curve is switched at the second switching voltage $V_2$, the critical voltage of the variable resistor rises to a third critical voltage $V_t''$. The third critical voltage $V_t''$ may be equal to or higher than the second switching voltage $V_2$. When the current-voltage curve follows the third path III, the current sharply decreases at a higher voltage than the third critical voltage $V_t''$. When the voltage rises to a third switching voltage $V_3$ higher than the third critical voltage $V_t''$ and then drops, the current-voltage curve returns along a fourth path IV.

When current flowing through the variable resistor is measured at the read voltage lower than the first critical voltage $V_t$, the detection of the third current value $I_2$ on the third path III corresponds to a data '10', while detection of a fourth current value $I_3$ on the fourth path IV corresponds to a data '11'.

According to some embodiments of the present invention, in the process described with reference to FIGS. 3A through 3C, data values of '00', '01', '10', and/or '11' can be written in the variable resistor. In order to initialize data written in the variable resistor to '00', a reset voltage having an opposite polarity to a write voltage is applied to the variable resistor.

Referring to FIG. 3D, the reset voltage having the opposite polarity to the write voltage is applied to the variable resistor so that trapped charges involved in an NDR behavior and/or a potential barrier can be initialized. The reset voltage may be equal to or higher than a breakdown voltage of the variable resistor.

In the above-described embodiments, data '00', '01', '10', and '11' can be written in the variable resistor by gradually increasing a binary number in ascending order. However, when a current-voltage curve returns using a different path according to a switching voltage, data can be arbitrarily written in the variable resistor. In this case, a highest switching voltage may be set to a voltage lower than a breakdown voltage of an insulating layer used as the variable resistor.

Figure 4A:
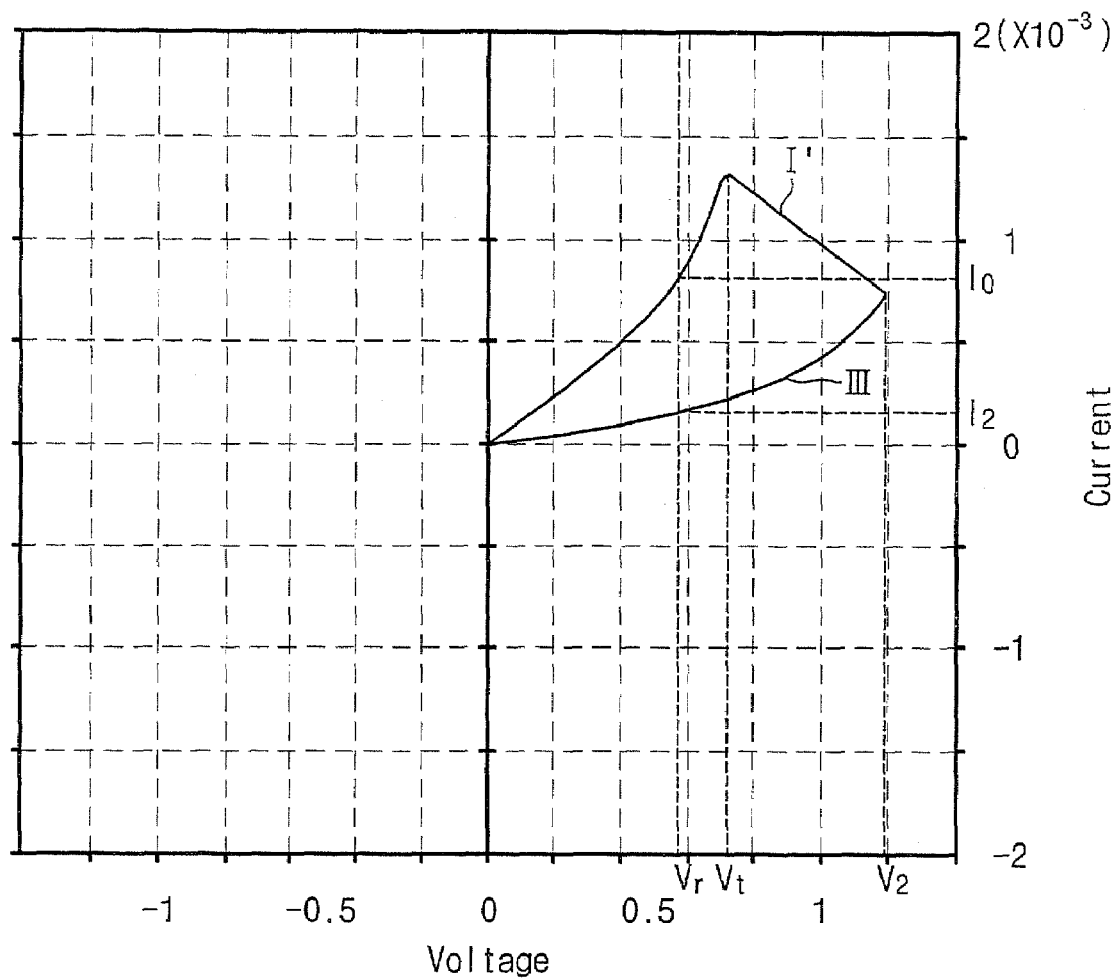
FIGS. 4A, 4B, and 5 are graphs illustrating methods of operating nonvolatile memory devices according to further embodiment of the present invention.
Figure 4B:
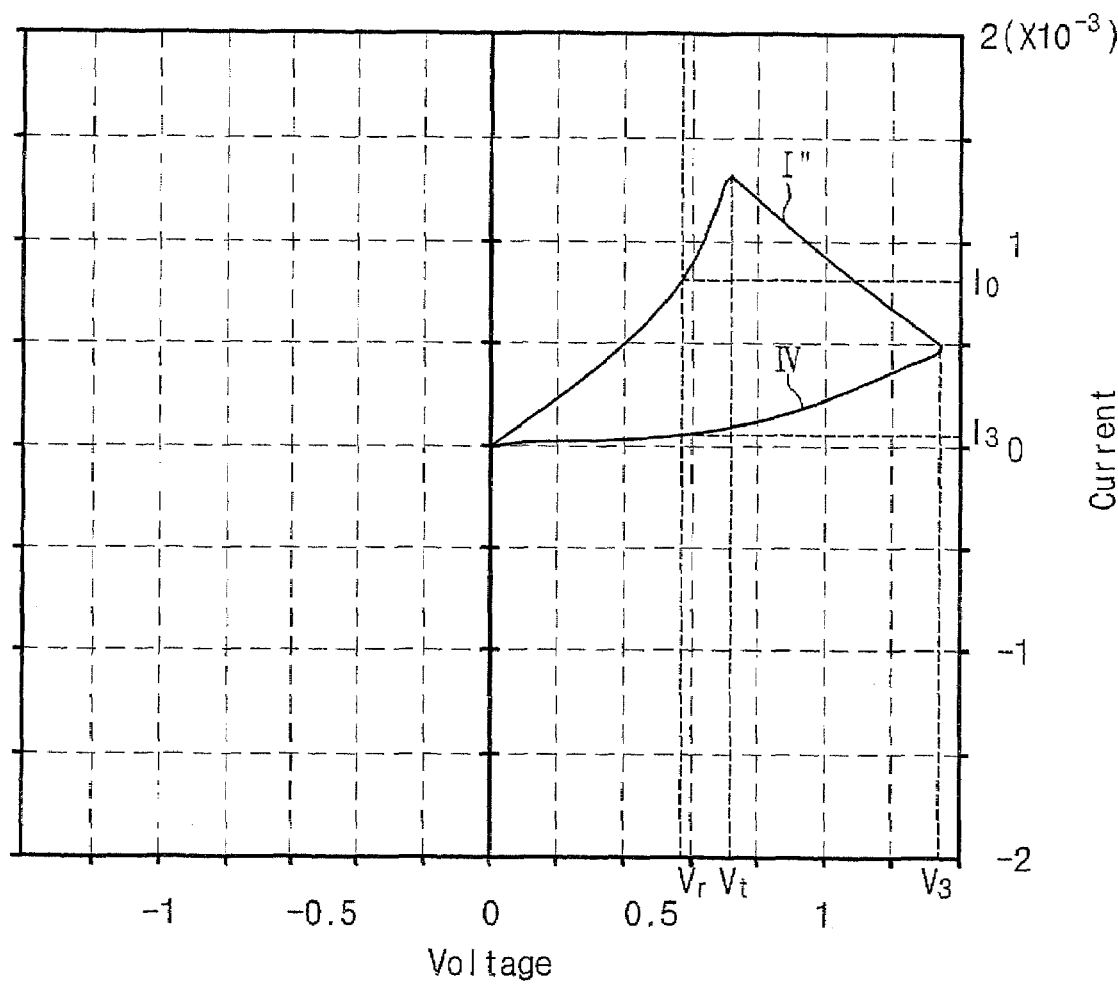
Figure 5:
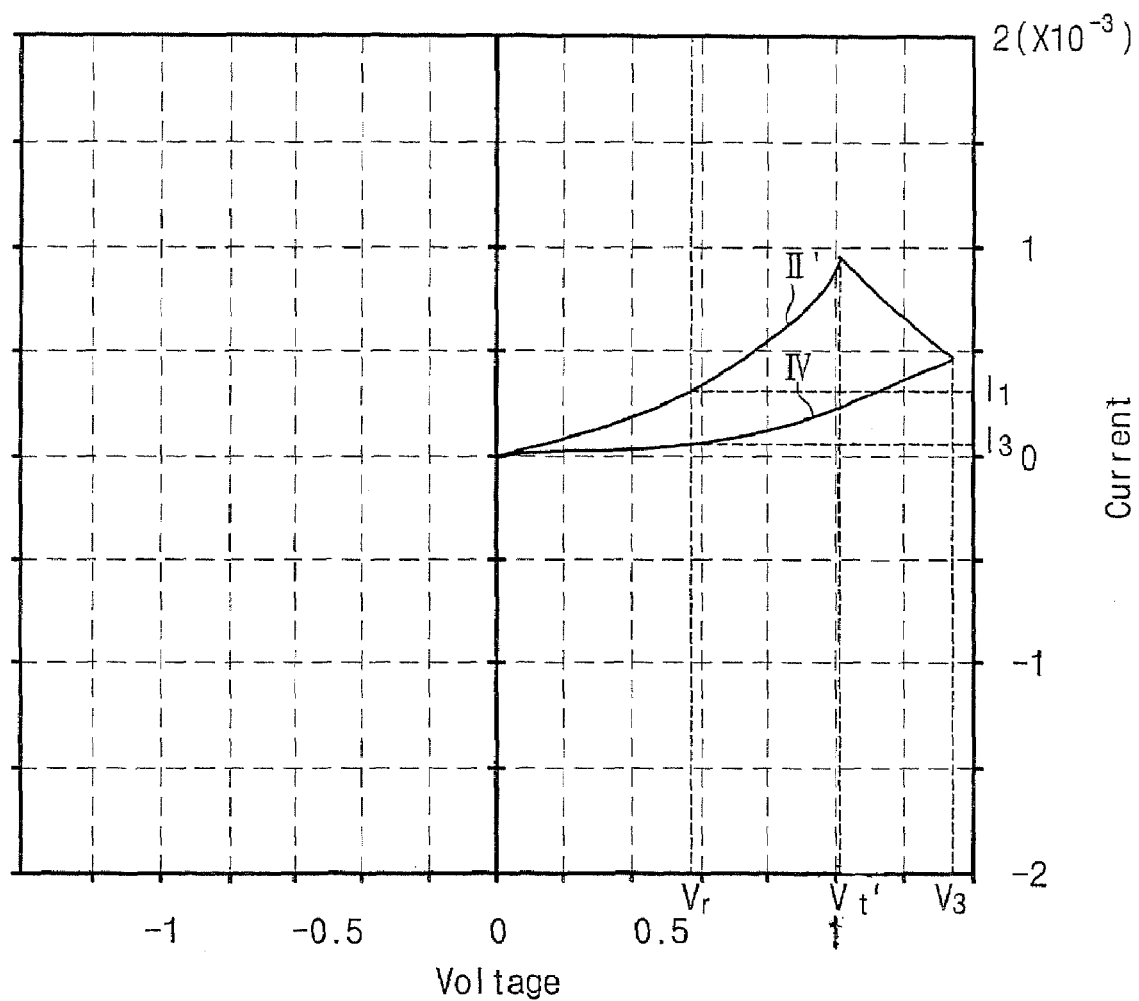

FIGS. 4A, 4B, and 5 are graphs illustrating methods of operating nonvolatile memory devices, specifically, arbitrary writing of data, according to further embodiments of the present invention.

Writing of a data '10' from a data '00' state will be described with reference to FIG. 4A. In an initialization state (data '00'), when an applied voltage rises to a second switching voltage $V_2$ higher than a first critical voltage $V_t$ and drops, current follows a first path I' during a voltage rising period and follows a third path III during a voltage dropping period. After a voltage-current curve is switched at the second switching voltage $V_2$, when the voltage is applied to the variable resistor, the current varies along the third path III.

When current flowing through the variable resistor is measured at a read voltage $V_r$ lower than the first critical voltage $V_t$, detection of a first current value $I_0$ on the first path I' corresponds to a data '00', while detection of a third current value $I_2$ on the third path III corresponds to a data '10'.

Writing of a data '11' from a data '00' state will be described with reference to FIG. 4B. In the initialization state (data '00'), when the applied voltage rises to a third switching voltage $V_3$ higher than the first critical voltage $V_t$ and drops, the current follows a first path I'' during the voltage rising period and follows a fourth path IV during the voltage dropping period. After the voltage-current curve is switched at the third switching voltage $V_3$, when the voltage is applied to the variable resistor, the current varies along the fourth path IV.

When current flowing through the variable resistor is measured at the read voltage $V_r$ lower than the first critical voltage $V_t$, detection of the first current value $I_0$ on the first path I'' corresponds to a data '00', while detection of a fourth current value $I_3$ on the fourth path IV corresponds to a data '11'.

Writing of a data '11' from a data '01' state will be described with reference to FIG. 5. After the voltage-current curve is switched at the first switching voltage $V_1$, a critical voltage of the variable resistor rises to a second critical voltage $V_t'$. The second critical voltage $V_t'$ may be equal to or higher than the first switching voltage $V_1$. When the current-voltage curve follows the second path II', the current sharply decreases at a higher voltage than the second critical voltage $V_t'$. When the voltage rises to a third switching voltage $V_3$ higher than the second critical voltage $V_t'$ and then drops, the current-voltage curve returns along a fourth path IV.

When current flowing through the variable resistor is measured at the read voltage $V_r$ lower than the first critical voltage $V_t$, detection of the second current value $I_1$ on the second path II' corresponds to a data '01', while detection of a fourth current value $I_3$ on the fourth path IV corresponds to a data '11'.

Figure 6:
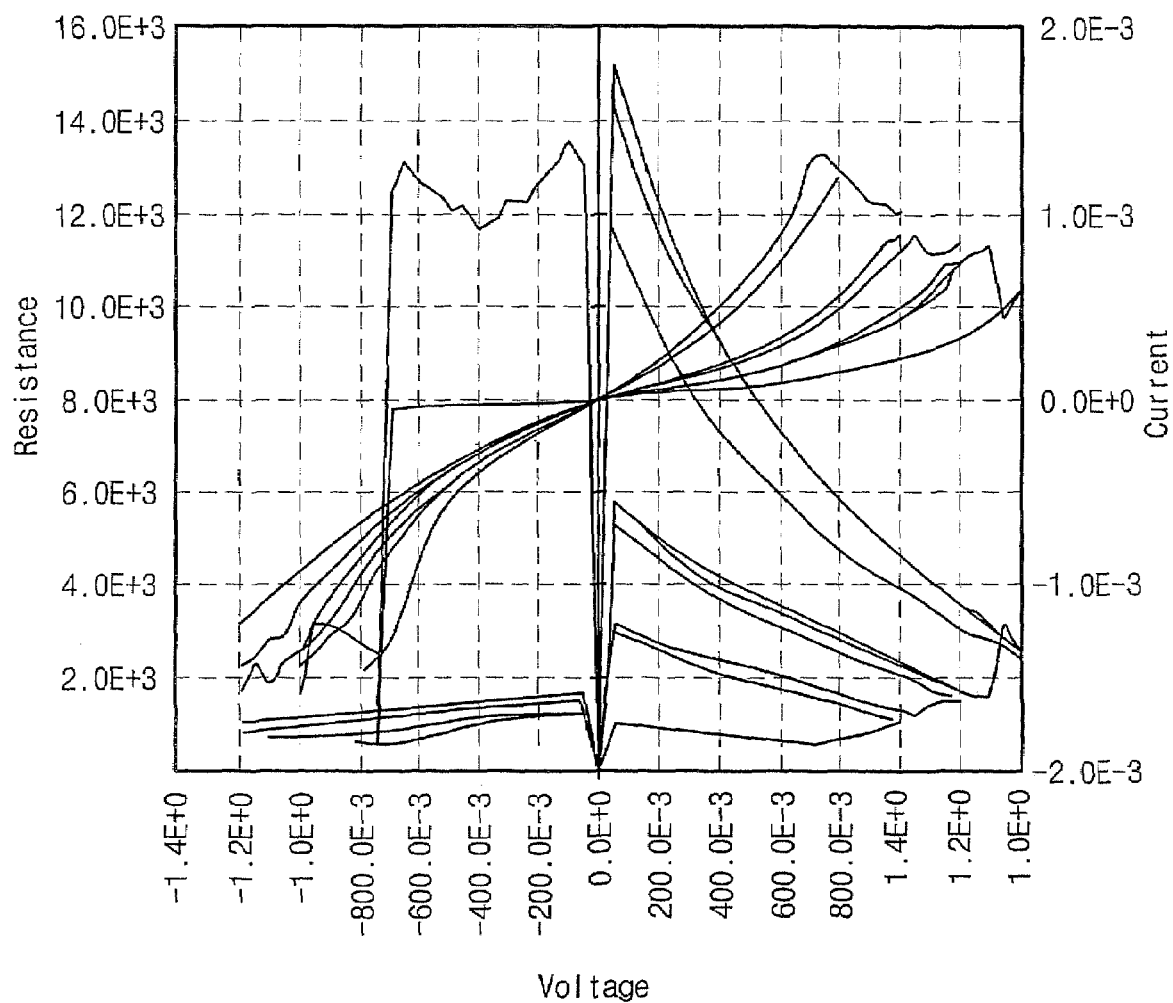
FIG. 6 is a graph of results of an experiment conducted when a voltage applied to a variable resistor according to some embodiments of the present invention rises to a switching voltage and subsequently drops.
Figure 7:
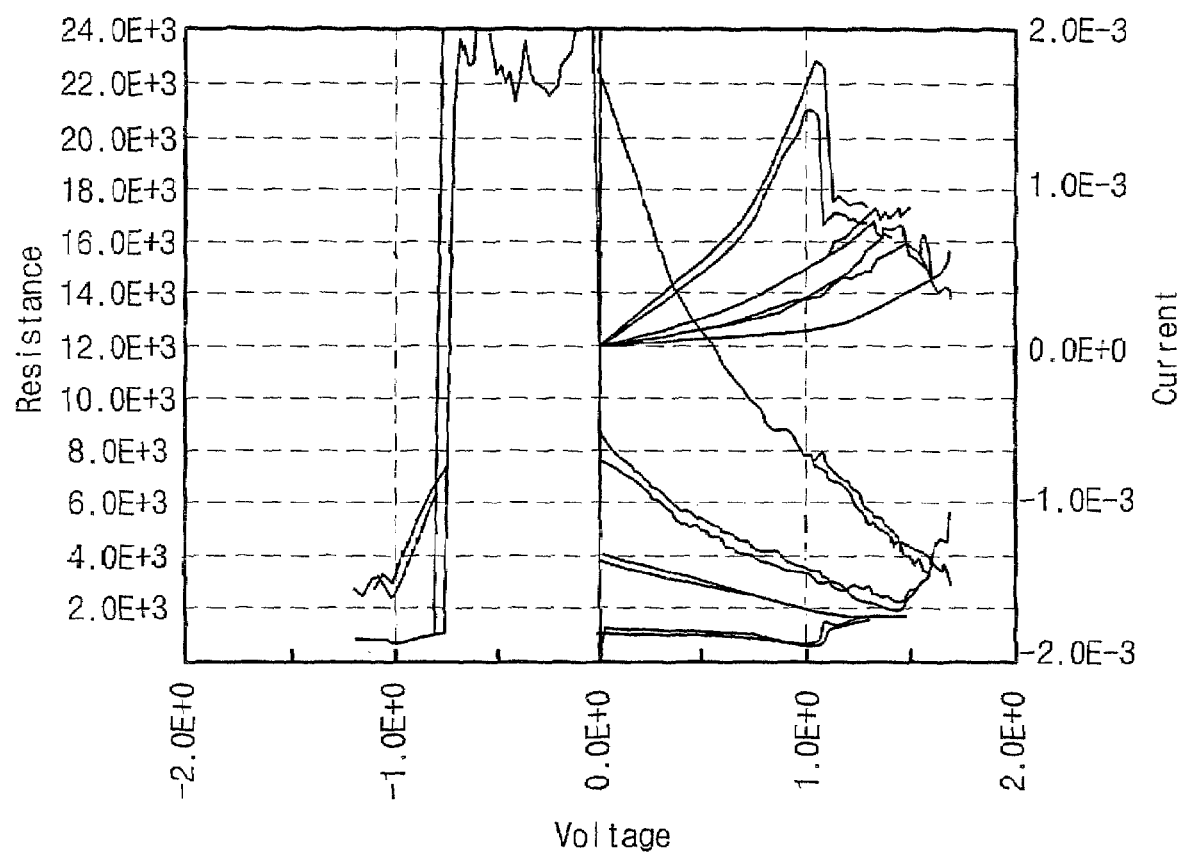
FIG. 7 is a graph of results of an experiment conducted when a voltage pulse is applied to a variable resistor according some embodiments of to the present invention.

FIG. 6 is a graph of results of an experiment conducted when a voltage applied to a variable resistor according to the present invention rises to a switching voltage and drops, and FIG. 7 is a graph of results of an experiment conducted when a voltage pulse is applied to the variable resistor.

Referring to FIGS. 6 and 7, whether the voltage increases or the voltage pulse is applied, in both cases, the variable resistor has switching characteristics and a resistance-voltage curve and a current-resistance curve are switched.

A storage cell that was 50 nm wide by 100 nm long was used as a sample and included a 7 Å-thick magnesium oxide (MgO) layer functioning as a variable resistor for an MRAM storage structure. Although the MRAM storage structure was used in the present experiments, when first and second electrodes disposed on both sides of the variable resistor were formed of a noble metal, the interfacial characteristics of the variable resistor can be improved. Noble metals are metals that are resistant to corrosion or oxidation. Examples of noble metals include gold, silver, tantalum, platinum, palladium and rhodium. Also, by improving crystal alignment of the magnesium oxide layer, data can become more discriminative.

The above-described results were uniformly obtained when a switching time varied from 1000 ns to 10 ns. Considering a tendency related with the switching time, it is expected that the switching characteristic according to the present invention will be represented even at a switching time of shorter than 10 ns.

As described above, a storage element according to embodiments of the present invention has good characteristics when a variable resistor has a thickness of 15 Å or less and a storage cell has a dimension of 100 nm or less. In other words, as the thickness of the variable resistor and/or the dimension of the storage cell decrease, the storage element according to embodiments of the present invention may have better effects. Therefore, as the integration density of memory devices can increase, the applicable tolerance of the storage according to the present invention also increases. Also, the storage according to the present invention can provide a memory device that operates at a switching rate of 10 ns or lower and is capable of storing multi-bit data.

Furthermore, since a storage element according to the present invention employs a metal insulating layer unlike conventional Perovskite structures such as PCMO, formation of the storage element may be followed by a subsequent process performed at a high temperature of 600° C. or higher. As a result, a thermally stable memory device can be provided.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A nonvolatile memory device comprising:
a first electrode and a second electrode; and
a variable resistor interposed between the first and second electrodes;
wherein the variable resistor has a critical voltage; and
wherein a resistance-voltage characteristic of the variable resistor is switched at a voltage higher than the critical voltage so that a resistance of the variable resistor is higher when measured at a read voltage after the switching of the resistance-voltage characteristic than when measured at the read voltage before the switching of the resistance-voltage characteristic.

2. The device as recited in claim 1, wherein the variable resistor has a thickness of about 5 Å to about 15 Å.

3. The device as recited in claim 1, wherein the variable resistor has a lateral dimension of about 10 nm to about 60 nm.

4. The device as recited in claim 1, wherein the variable resistor comprises a magnesium oxide layer, a hafnium oxide layer, a zirconium oxide layer, a titanium oxide layer, a silicon oxide layer, and/or a stacked layer thereof.

5. The device as recited in claim 1, wherein the critical voltage of the variable resistor is higher after the switching of the resistance-voltage characteristic than before the switching of the resistance-voltage characteristic.

6. The device as recited in claim 1, wherein when a voltage applied to the variable resistor rises to a first voltage lower than the critical voltage and subsequently drops, the resistance of the variable resistor in a period in which the applied voltage drops from the first voltage returns along a resistance-voltage curve followed in a period in which the applied voltage rises to the first voltage.

7. The device as recited in claim 6, wherein, when the voltage applied to the variable resistor rises to a first switching voltage higher than the critical voltage and subsequently drops, the resistance-voltage characteristic is switched, and wherein the resistance of the variable resistor in a period in which the applied voltage drops from the first switching voltage returns along a different path than a resistance-voltage curve followed in a period in which the applied voltage rises to the first switching voltage.

8. The device as recited in claim 7, wherein, in the resistance-voltage curve, the resistance of the variable resistor is higher in the period in which the applied voltage drops from the first switching voltage than in the period in which the applied voltage rises to the first switching voltage.

9. The device as recited in claim 7, wherein the critical voltage is at a first critical voltage level, and wherein the critical voltage of the variable resistor rises to a second critical voltage level in response to application of the first switching voltage higher than the first critical voltage level.

10. The device as recited in claim 9, wherein, after the critical voltage of the variable resistor is increased to the second critical voltage level, when the applied voltage rises to a second voltage lower than the second critical voltage level and drops, the resistance of the variable resistor in a period in which the applied voltage drops from the second voltage returns along a resistance-voltage curve followed in a period in which the applied voltage rises to the second voltage.

11. The device as recited in claim 9, wherein, when the voltage applied to the variable resistor rises to a second switching voltage higher than the second critical voltage level and subsequently drops, the resistance-voltage characteristic is again switched, so that the resistance of the variable resistor in a period in which the applied voltage drops from the second switching voltage returns along a different path than a resistance-voltage curve followed in a period in which the applied voltage rises to the second switching voltage.

12. The device as recited in claim 11, wherein the resistance of the variable resistor is higher in the period in which where the applied voltage drops from the second switching voltage than in the period in which the applied voltage rises to the second switching voltage.

13. The device as recited in claim 11, wherein the critical voltage of the variable resistor rises to a third critical voltage level in response to application of the second switching voltage.

14. The device as recited in claim 11, wherein the third critical voltage level is equal to the second switching voltage.

15. The device as recited in claim 1, wherein the variable resistor has a current-voltage characteristic;
wherein, when a voltage applied to the variable resistor rises to a first voltage lower than the critical voltage and subsequently drops, current through the variable resistor in a period in which the applied voltage drops from the first voltage returns along a first current-voltage curve followed in a period in which the applied voltage rises to the first voltage;
and wherein, when the applied voltage rises to a switching voltage higher than the critical voltage and subsequently drops, current through the variable resistor in a period in which the applied voltage drops from the switching voltage returns along a second current-voltage curve that is different from the first current-voltage curve.

16. The device as recited in claim 15, wherein the current through the variable resistor indicates data stored in the device when measured at a read voltage lower than the critical voltage.

17. The device as recited in claim 16, wherein a first current corresponding to the read voltage in the first current-voltage curve represents a first data value and a second current corresponding to the read voltage in the second current-voltage curve represents a second data value.

18. The device as recited in claim 1, wherein, after the resistance-voltage characteristic is switched, the variable resistor is initialized in response to a reset voltage applied thereto having a polarity opposite to a polarity of the read voltage and a voltage level higher than the critical voltage.

19. A nonvolatile memory device comprising a variable resistor functioning as a storage node, wherein the variable resistor has a critical voltage and a switched resistance-voltage characteristic, wherein, when a voltage applied to the variable resistor rises to a first voltage lower than the critical voltage and subsequently drops, a resistance of the variable resistor in a voltage dropping period returns along a resistance-voltage curve followed in a voltage rising period, wherein, when the applied voltage rises to a switching voltage higher than the critical voltage and subsequently drops, the resistance of the variable resistor is higher in the voltage dropping period than in the voltage rising period, and wherein, when a voltage higher than the critical voltage is applied to the variable resistor, the critical voltage of the variable resistor increases.

20. The device as recited in claim 19, wherein the critical voltage rises to the switching voltage in response to application of the switching voltage to the variable resistor.

21. The device as recited in claim 19, wherein, after the switching voltage is applied to the variable resistor, the critical voltage increases in proportion to the switching voltage.

22. The device as recited in claim 21, wherein, after the critical voltage of the variable resistor is increased, when the applied voltage rises to a second voltage lower than the increased critical voltage and subsequently drops, the resistance of the variable resistor in the voltage dropping period returns along a resistance-voltage curve followed in the voltage rising period, wherein, when the applied voltage rises to a second switching voltage higher than the increased critical voltage and subsequently drops, the resistance of the variable resistor is higher in the voltage dropping period than in the voltage rising period, and wherein, when a voltage higher than the increased critical voltage is applied to the variable resistor, the critical voltage increases again.

23. The device as recited in claim 19, wherein, when the applied voltage rises to the switching voltage higher than the critical voltage and subsequently drops, a difference in the resistance of the variable resistor between the voltage rising period and the voltage dropping period increases in proportion to the switching voltage.

24. A method of operating a nonvolatile memory device comprising a variable resistor functioning as a storage node, wherein the variable resistor has a critical voltage and a switched resistance-voltage characteristic, wherein, when a voltage applied to the variable resistor rises to a switching voltage higher than the critical voltage, the critical voltage rises in proportion to the applied voltage, wherein, when the applied voltage rises to a voltage lower than the critical voltage and subsequently drops, a resistance of the variable resistor in a voltage dropping period returns along a resistance-voltage curve followed during a voltage rising period, and wherein, when the applied voltage rises to a switching voltage higher than the critical voltage and subsequently drops, the resistance of the variable resistor is higher in the voltage dropping period than in the voltage rising period, the method comprising:

setting a plurality of write voltages higher than an initial critical voltage;

assigning respective data values to states where the resistance-voltage curve is switched at the plurality of write voltages;

setting a read voltage lower than the initial critical voltage; and reading the data values by measuring current flowing through the variable resistor in response to the read voltage.

25. The method as recited in claim 24, further comprising initializing the resistance and critical voltage of the variable resistor by applying an erase voltage having an opposite polarity to the read voltage to the variable resistor.

* * * * *